United States Patent

Callahan

[11] Patent Number: 5,923,598
[45] Date of Patent: Jul. 13, 1999

[54] ROW FUSE DETECT CIRCUIT

[75] Inventor: John M. Callahan, San Ramon, Calif.

[73] Assignee: Enable Semiconductor, Inc., Milpitas, Calif.

[21] Appl. No.: 09/063,818

[22] Filed: Apr. 21, 1998

[51] Int. Cl.$^6$ ..................................... G11C 7/00
[52] U.S. Cl. ...................... 365/200; 365/201; 365/189.05
[58] Field of Search .................................. 365/200, 201, 365/189.05

[56] References Cited

U.S. PATENT DOCUMENTS

| 5,555,522 | 9/1996 | Anami et al. | 365/200 |
| 5,680,354 | 10/1997 | Kawagoe | 365/200 |
| 5,761,128 | 6/1998 | Watanabe | 365/189.01 |

*Primary Examiner*—David Nelms
*Assistant Examiner*—VanThu Nguyen
*Attorney, Agent, or Firm*—Patrick T. King

[57] ABSTRACT

A row identification circuit identifies which redundant-row fuse has been blown in a memory integrated-circuit by electrically interrogating the integrated-circuit using a switching circuit internal to the memory integrated-circuit. N data output terminals of the memory integrated circuit provide an n-bit binary-coded word which identifies a defective row. To bring out the binary fuse data, the chip is put into a test mode with a TESTF signal which shuts off a normal CMOS transmission gate as well as a latch feedback transmission gate and which turns on another CMOS transmission gate to pass a defective row address bit FUSEB to a data output terminal for the memory device. A switching circuit selectively switches either a defective row address bit TESTB or a data input signal DIN to a data output terminal of the memory integrated circuit. The switching circuit is selectively controlled by a test mode control signal TESTF. For an entire memory integrated circuit, a plurality of switching circuits are provided for each bit of the code word for providing the defective row number.

14 Claims, 2 Drawing Sheets

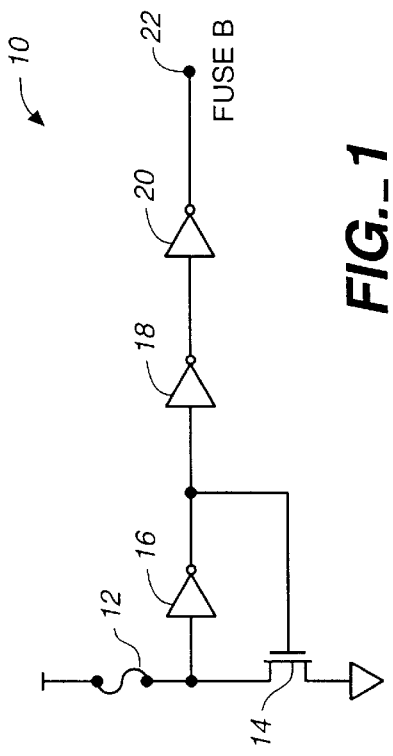
FIG._1
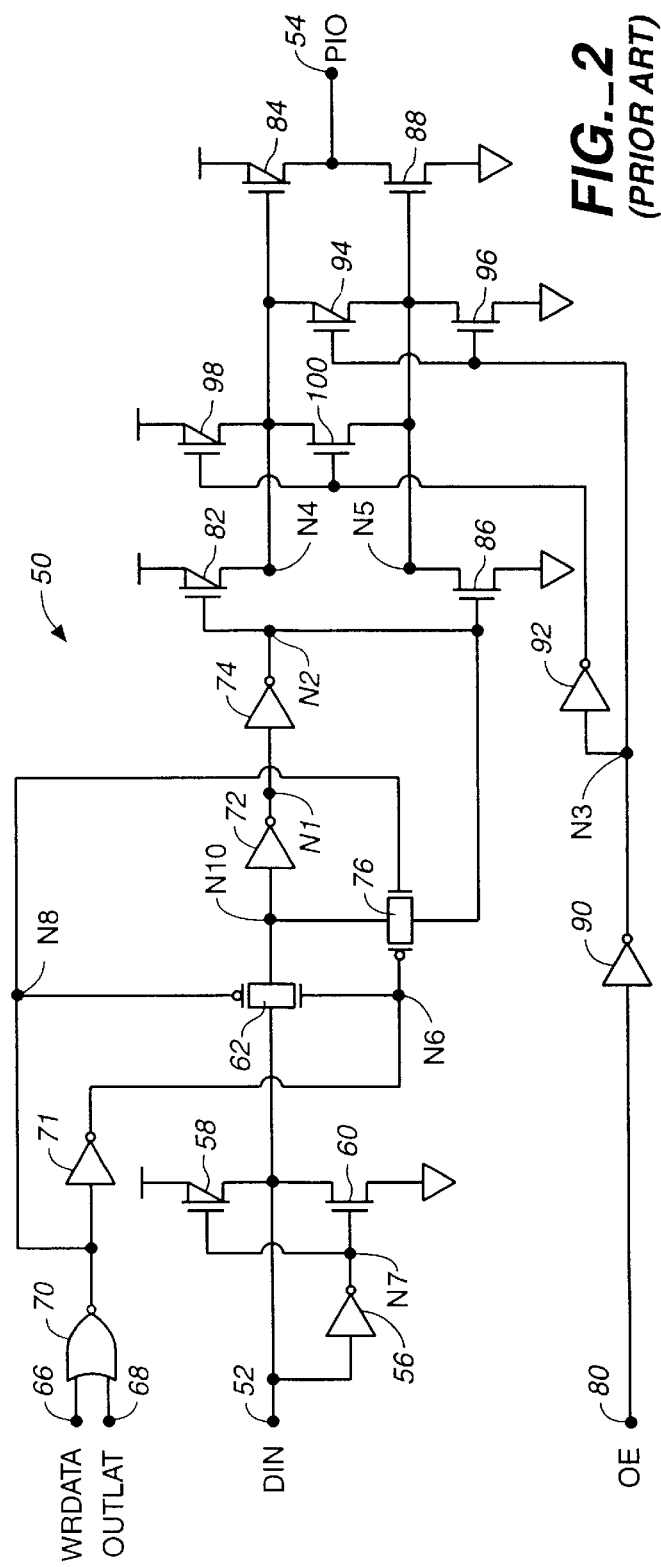
FIG._2 (PRIOR ART)

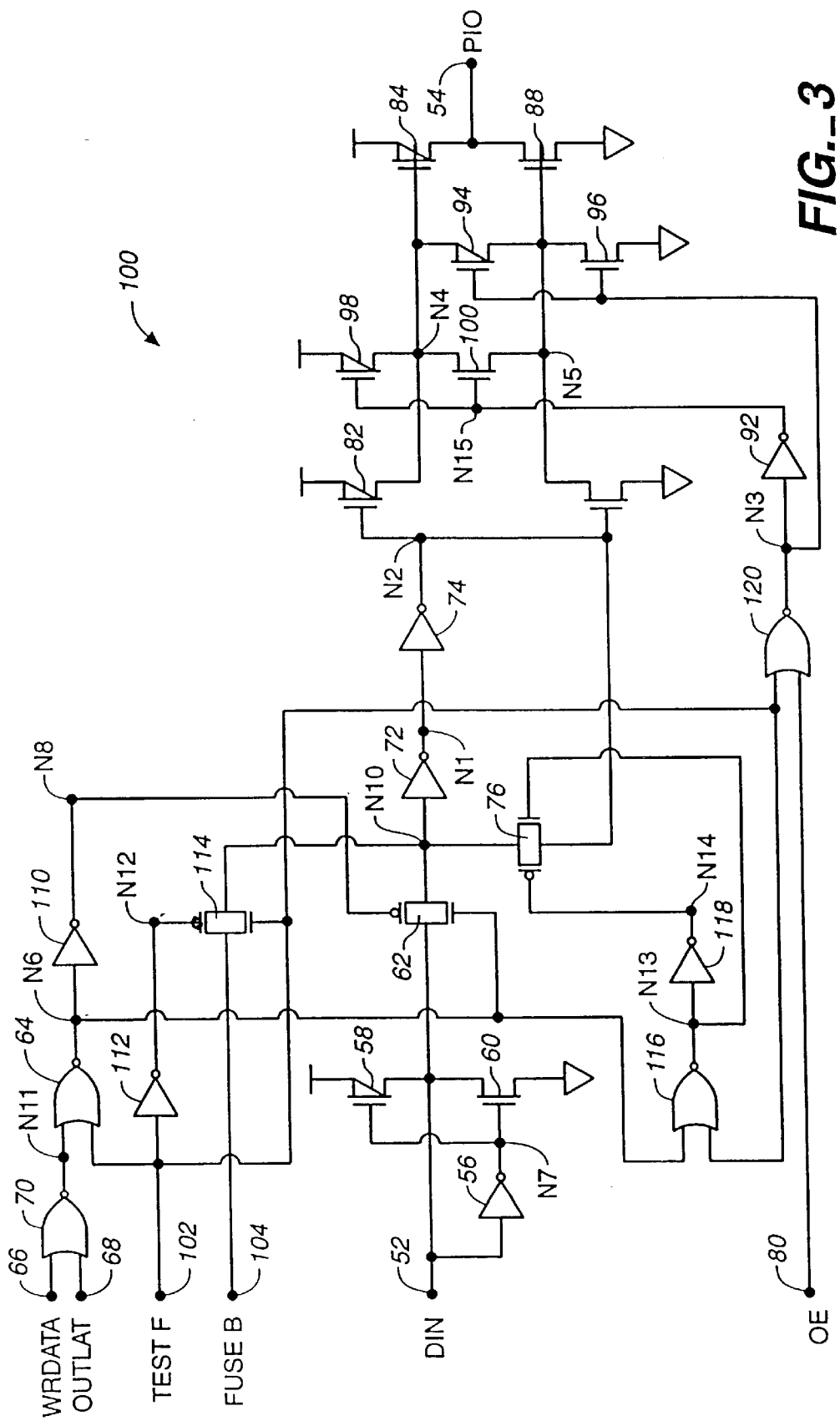
FIG._3

ROW FUSE DETECT CIRCUIT

BACKGROUND OF THE INVENTION

1. Field of the Invention

This invention relates to memory integrated circuits and, more particularly, to techniques for electronically interrogating the memory integrated circuit to determine the number of a defective row.

2. Prior Art

Integrated-circuit memories are provided with redundant rows to increase production yield. When a memory row is found to be defective, a redundant row is substituted for the defective row by blowing a fuse associated with that defective row. For Quality Assurance purposes, it is desirable to identify which fuse has been blown in a packaged integrated-circuit device. One way to do this is to etch away enough of the package material with acid to expose all of the fuses and then use a microscope to visually check all of the fuses to see which fuse had been blown, if any. This is a slow and laborious process which limits the amount of data available for statistical analysis.

It is desirable to be able to ascertain which fuse has been blown in a memory integrated-circuit by just electrically interrogating the integrated-circuit, or chip, without having to use acid to etch away some of the material of an integrated-circuit package and without having to visually inspect all of the fuses in the etched part.

SUMMARY OF THE INVENTION

It is therefore an object of the invention to provide a circuit which identifies which fuse has been blown in a memory integrated-circuit by electrically interrogating the integrated-circuit, or chip, without having to use acid to etch away some of the material of an integrated-circuit package.

This is accomplished by utilizing n data output terminals of the memory integrated circuit to provide an n-bit binary-coded word which identifies a defective row. Each of the n output data terminals provides one of the binary bits. for the n-bit binary code word for identification of a blown row fuse. Eight output bits can encode a code number for one of 256 row fuses. If more than eight output bits are required, some of the input address pins of a memory integrated circuit can be converted to input/output pins. Sixteen output bits can code one of 65,536 fuses.

To bring out the binary fuse data to the output pins of the memory chip, the chip is put into a test mode by alternate means, making signal TESTF a ONE. This shuts off a normal CMOS transmission gate as well as a latch feedback transmission gate. Another CMOS transmission gate is turned on between the memory row data bit FUSEB and the data output terminal for the memory device.

A row-fuse status reporting system for a memory integrated-circuit includes a switching circuit for selectively switching either a blown-row-fuse status bit FUSEB or a data input signal DIN to a data output terminal of a memory integrated circuit. The switching circuit is selectively controlled by a test mode control signal TESTF. For an entire memory integrated circuit, a plurality of switching circuits are provided for each bit of the code word for providing the defective row number.

The switching circuit includes a first CMOS transmission gate which has an input terminal coupled to a data input terminal for receiving an input signal DIN and which has an output terminal coupled to the data output terminal at which is provided an output signal PIO. The first CMOS transmission gate also has first and second control terminals to which are respectively coupled a TESTF signal and an inverted TESTF signal.

The switching circuit also has a second CMOS transmission gate with an input terminal coupled to a data input terminal for receiving an input signal FUSEB and with an output terminal coupled to the data output terminal of the first CMOS transmission gate. The second CMOS transmission gate has first and second control terminals to which are respectively coupled the TESTF signal and an inverted TESTF signal.

The invention further includes a circuit for disabling both the first CMOS transmission gate and a latch circuit connected to the output terminal of the first CMOS transmission gate when the TESTF signal is active. The invention includes an output buffer which, when in a data transmission mode, is enabled by an Output Enable (OE) signal to transmit data through said output buffer in a normal data mode. The output buffer is not disabled when in the test mode.

BRIEF DESCRIPTION OF THE DRAWINGS

The accompanying drawings, which are incorporated in and form a part of this specification, illustrate an embodiment of the invention and, together with the description, serve to explain the principles of the invention:

FIG. 1 is a circuit diagram of a circuit which stores one bit FUSEB of a code word which identifies a defective row of a memory integrated-circuit.

FIG. 2 is a circuit diagram for a standard memory output buffer connected to one data output terminal of a memory integrated circuit.

FIG. 3 is a circuit diagram for a memory output buffer circuit which includes a switching circuit for selectively switching either a blown-row-fuse status bit TESTB or a data input bit signal DIN to a data output terminal of a memory integrated circuit wherein the switching circuit is selectively controlled by a test mode control signal TESTF.

DETAILED DESCRIPTION OF THE PREFERRED EMBODIMENTS

Reference will now be made in detail to a preferred embodiment of the invention, an example of which is illustrated in the accompanying drawings. While the invention will be described in conjunction with the preferred embodiment, it will be understood that is not intended to limit the invention to this embodiment. On the contrary, the invention is intended to cover alternatives, modifications and equivalents, which may be included within the spirit and scope of the invention as defined by the appended claims.

FIG. 1 shows a bit-storage circuit 10 for storing one bit of a n-bit binary-coded code word. The n-bit binary-coded code word identifies a defective row in a memory integrated-circuit. When a memory integrated-circuit is initially tested and a defective memory row is found, a fuse associated with that defective memory row is blown in the integrated circuit to substitute a backup row to effectively repair the defective row. The row number of the repaired, defective row is then recorded and converted to a n-bit binary-coded code word. The n bits of the code word are individually stored in n circuits similar to the storage circuit 10 by blowing a fuse with a laser beam in each bit-storage circuit for a ONE bit in the code word. The bit-storage circuit 10 includes a fuse 12 which is blown by a laser for a ONE bit. One end of the fuse 12 is connected to a Vcc source. The other end of the fuse 12 is connected to a drain terminal of a NMOS transistor 14 and to the input terminal of an inverter 16. A source terminal of the NMOS transistor 14 is connected to a Vss ground. The output terminal of the inverter 16 is connected to a gate terminal of the NMOS transistor 14 and to an input terminal of a first inverter 18. The output terminal of the first inverter 18 is connected to an input terminal of a second inverter 20. The output terminal of the second inverter 20 is connected to a bit terminal 22 at which is provided a FUSEB signal.

When the fuse 12 is blown, or open circuited, the inverter 16 provides a ONE, or HIGH, signal to the gate terminal of the NMOS transistor 14. When the fuse 12 is not blown, FUSEB is LOW. N circuits similar to bit-storage circuit 10 provide the n bits for binary encoding the n-bit binary-encoded word identifying a defective, internally-repaired memory row.

FIG. 2 shows a standard memory output buffer circuit 50 for a memory integrated circuit. A buffer system 50 is provided for each output terminal of the integrated circuit. A number of such buffer circuits are used to provide the output bits corresponding to a particular memory address of a defective row. The buffer circuit 50 receives an input data signal DIN at an input terminal 52 and provides a data output bit signal PIO at an output terminal 54. The source impedance of the circuit driving the input terminal 52 may be high at times so that the input terminal for the DIN signal floats.

A slow acting high-impedance latch circuit is used to hold the level of the input signal DIN at a high or low level. The holding latch circuit includes an inverter 56 which has an input terminal connected to the input terminal 52 and an output terminal connected to the gate of a PMOS transistor 58 and to the gate of an NMOS transistor 60. Both the MOS transistor 58 and the NMOS transistor 60 have relatively high channel resistances. A source terminal of the PMOS transistor 58 is connected to a Vcc source and a drain terminal of the PMOS transistor 58 is connected to the input terminal 52. A drain terminal of the NMOS transistor 60 is connected to the input terminal 52 and a source terminal of the NMOS transistor 60 is connected to a Vss ground. A strong input signal DIN signal at the input terminal of the inverter 56 forces either the PMOS transistor 58 or the NMOS transistor 60 to turn on and latch the input signal level on terminal 52.

A CMOS transmission gate 62 has an input terminal connected to the input terminal 52 and an output terminal N10. When it is turned on, the CMOS transmission gate 62 passes the signal at the input terminal 52 to terminal N10. The CMOS transmission gate 62 is turned on by a HIGH signal at terminal N6 and a LOW signal at terminal N8. A 2-input NOR gate 64 has a write data control signal WRDATA provided to one input terminal 70 and a pulsed output latch signal OUTLAT provided to the other input terminal 68. An output terminal N8 of the 2-input NOR gate 70 is connected to the PMOS input control gate terminal of the CMOS transmission gate 62. The output terminal of the 2-input NOR gate 64 is also connected to an input terminal of an inverter 71, which has an output terminal connected to the NMOS input control gate terminal of the CMOS transmission gate 62.

Normally both the WRDATA signal and the OUTLAT signal are at LOW levels, which turns off, or closes, the CMOS transmission gate 62. A HIGH level of the write data control signal WRDATA opens, or turns on, the CMOS transmission gate 62. The OUTLAT signal is a pulse, the HIGH level of which turns on the CMOS transmission gate 62 to provide the DIN signal to the output terminal N10 of the CMOS transmission gate 62.

Terminal N10 is also connected to an input terminal of a holding latch formed by serially connected inverters 72, 74 and a feedback CMOS transmission gate 76. An input terminal of the inverter 72 is connected to a terminal N10. An output terminal N1 of the inverter 72 is connected to an input terminal of the inverter 74. An output terminal N2 of the inverter 74 is connected to one terminal of the CMOS transmission gate 76. Another terminal of the CMOS transmission gate 76 is connected to terminal N10. When both the WRDATA signal and the OUTLAT signal are LOW, the signal at terminal N10 is held by the holding latch. The holding latch holds data while the DIN signal gets pre-charged during every clock cycle of the memory.

Terminal N2 of the holding latch is also an input terminal for an output buffer which is enabled by an OE signal at terminal 80.

The output buffer includes a PMOS driver transistor 82 which has its gate terminal connected to N2, which has a source terminal connected to a Vcc source, and which has a drain terminal connected to a terminal N4 and to a gate terminal of an output PMOS transistor 84. A source terminal of the output PMOS transistor 84 is connected to the Vcc source. A drain terminal of the output PMOS transistor 84 is connected to the output terminal 54.

The output buffer also includes a NMOS driver transistor 86 which has its gate terminal also connected to N2, which has a source terminal connected to a Vss ground, and which has a drain terminal connected to a terminal N5 and to a gate terminal of an output NMOS transistor 88. A source terminal of the output NMOS transistor 88 is connected to the Vss ground. A drain terminal of the output NMOS transistor 88 is connected to the output terminal 54.

The output PMOS transistor 84 and the output NMOS transistor 88 form a tri-state buffer. In a normal mode of operation the state of the tri-state buffer is controlled by the OE signal on terminal 80 and the data bit DIN.

The OE signal at terminal 80 is inverted by an inverter 90 to provide an inverted OE signal at a terminal N3. Terminal N3 is connected to a gate terminal of a PMOS transistor 94, which has its source terminal connected to N4 and its drain terminal connected to N5. Terminal N3 is also connected to a gate terminal of a NMOS transistor 96, which has its source terminal connected to the Vss ground and its drain terminal connected to N5.

The signal at N3 is inverted by another inverter 92, the output terminal of which is connected to a gate terminal of a PMOS transistor 98, which has its source terminal connected to the Vcc source and its drain terminal connected to N4. The output terminal of the inverter 92 is also connected to a gate terminal of a NMOS transistor 100, which has its drain terminal connected to N4 and its source terminal connected to N5.

When the OE signal is LOW, a HIGH signal is applied to the gates of the transistors 94, 96 to turn on the NMOS transistor 96 which pulls the gate terminal of the output NMOS transistor 88 to a LOW state to turn off the output NMOS transistor 88. When the OE signal is LOW, a LOW signal is also applied to the gates of transistors 98, 100 which turns off the NMOS transistor 100 and which turns on the PMOS transistor 98, applying Vcc to the gate terminal of the output PMOS transistor 84. When the OE signal is LOW, both the PMOS output transistor 84 and the NMOS output transistor 88 are turned off. The signal at terminal N2 is not delivered to the output terminal 54 and the output terminal 54 assumes a floating, high impedance state.

When the OE signal is HIGH, a LOW signal is applied to the gates of the transistors 94, 96 to turn off the NMOS transistor 96 and release the gate terminal of the output NMOS transistor 88. The PMOS transistor 94 is turned on and connects N4 and N5. When the OE signal is HIGH, a HIGH signal is applied to the gates of transistors 98, 100 which turns off the PMOS transistor 98 and which turns on the NMOS output transistor 100 to connect terminal N4 to terminal N5. This allows the turning on of either transistor 84 or transistor 88 and allows the signal at terminal N2 to appear at the output terminal 54.

FIG. 3 shows a row-fuse status reporting system 100 which is internally switched within a memory integrated circuit to provide normal memory data or else to provide one bit of an n-bit code word. The system 100 is selectively switched to alternatively provide one bit of a n-bit system which provides a n-bit code word at the output terminals of a memory integrated circuit. The n-bit code word identifies a defective-row address of the memory integrated circuit. The row-fuse status reporting system 100 is incorporated into an output buffer of the memory integrated-circuit and includes additional circuits which are added to the standard memory output buffer of FIG. 2 to provide for selectively switching either defective-row address or a data input bit signal DIN to a data output terminal. FIG. 3 uses the same reference numerals as FIG. 2 for similar circuit elements. The normal path for memory data going out of the memory integrated circuit is through terminals at DIN, N10, N1, N2, N4, N5 and PIO.

The row-fuse status reporting system 100 is selectively controlled by a test mode control signal TESTF, which is generated and provided to an input terminal 102. A FUSEB bit signal is provided at an input terminal 104, for example, from the bit-storage circuit 10, illustrated in FIG. 1, which stores one bit of a n-bit binary-coded code word which identifies a defective row in the associated memory integrated-circuit.

The output PMOS transistor 84 and the output NMOS transistor 88 form a tri-state buffer. In the normal mode of operation the state of the tri-state buffer is controlled by the OE signal on terminal 80 and the data bit DIN. In the test mode of operation the test mode control signal TESTF and the test bit FUSEB control the output state.

To provide the binary fuse data bit FUSEB at the output terminal 54, the chip is put into test mode by appropriate means which makes the TESTF signal at terminal 102 a ONE, or HIGH, logic level.

The sources of the control signals provided at terminals N6 and N8 for controlling the CMOS transmission gate 62 are modified to provide for closing the CMOS transmission gate and switching the FUSEB signal into output buffer when TESTF goes to a HIGH level.

The output terminal of the 2-input NOR gate 70, which receives the WRDATA signal and the OUTLAT signal, is connected to one input terminal of another 2-input NOR gate 64. The other input terminal of the 2-input NOR gate 64 is connected to the input terminal 102 for the TESTF signal. An output terminal of the 2-input NOR gate 64 is connected to terminal N6 which controls the NMOS transistor of the CMOS transmission gate 62. Terminal N6 is connected to an input terminal of an inverter 110. An output terminal of the inverter 110 is connected to terminal N8 which controls the PMOS transistor of the CMOS transmission gate 62. When the TESTF signal goes HIGH, N6 goes LOW and N8 goes HIGH to disable or close the CMOS transmission gate 62.

An inverter has an input terminal connected to the TESTF terminal 102. The output terminal N12 of the inverter 112 is connected to the gate terminal of a PMOS transistor which is part of a CMOS transmission gate 114. The TESTF input terminal 102 is also connected to a gate terminal of a NMOS transistor which is part of the CMOS transmission gate 114. An input terminal of the CMOS transmission gate 114 is connected to the FUSEB input terminal 104 and an output terminal of the CMOS transmission gate 114 is connected to terminal N10. When the TESTF signal goes HIGH, terminal N12 goes LOW to turn on the CMOS transmission gate 114 and provide the FUSEB signal at terminal N10.

Terminal N6 is connected to one input terminal of a 2-input NOR gate 116. The TESTF input terminal 102 is connected to the other input terminal of the 2-input NOR gate 116. The output terminal of the 2-input NOR gate 116 is connected to the gate terminal of the NMOS transistor for the CMOS transmission gate 76. The output terminal of the 2-input NOR gate 116 is also connected to an input terminal of an inverter 118 which has its output terminal connected to the gate of the PMOS transistor of the CMOS transmission gate 76. The feedback CMOS transmission gate 76 is also disabled by the TESTF signal. When the TESTF signal goes HIGH, terminal N13 goes LOW and the feedback CMOS transmission gate 76 is turned off.

In summary, when the TESTF signal goes HIGH, the CMOS transmission gate 62 and the CMOS transmission gate 76 are both shutoff and the CMOS transmission gate 114 between FUSEB and N10 is turned on to send the FUSEB data to the output buffer.

A 2-input NOR gate 120 is used to combine the TESTF signal and the OE signal to provide a signal at terminal N3 that makes the switching operation independent of the OE signal when TESTF is HIGH.

When a memory integrated circuit is initially tested and a defective row is found, the fuse associated with that defective row is blown within the integrated circuit and the number of the defective row is recorded. Each of the n output terminals provides one of the binary bits for a n-bit binary code word which identifies a blown row fuse. Eight output bits can encode a code number for one of 256 row fuses. If more than eight output bits are required, some of the input address pins of a memory integrated circuit can be converted to input/output pins. Sixteen output bits can code one of 65,536 fuses. The defective row number is binary coded by blowing the fuses in the bit storage circuits 10 of FIG. 1 to store a binary-coded number representing the defective row number. The integrated circuit is interrogated by setting the TESTF signal HIGH and observing the data bits at the output pins which encode the defective row number. Using this technique, it is now possible to compile a large amount of statistical data regarding which row fuses have been blown in parts by utilizing an automatic tester that electrically interrogates packaged parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A status reporting system for reporting one bit of a code word identifying a defective row of a memory integrated-circuit, comprising an internal switching circuit for selectively switching either a defective row address bit (FUSEB) or a memory data bit (DIN) to a data output pin of a memory integrated circuit, wherein said internal switching circuit is selectively controlled by a test mode control signal (TESTF) to provide either a memory data bit or a defective row address bit to the data output pin of the memory integrated circuit.

2. The status reporting system of claim 1 including a plurality of said internal switching circuits, each of said plurality of internal switching circuits selectively switching one of a plurality of defective row address bits or memory data bits to a respective one of a plurality of data output pins of the memory integrated circuit wherein said internal switching circuits are selectively controlled by the test mode control signal and wherein said plurality of defective row address bits identify a defective row in the memory integrated circuit.

3. The status reporting system of claim 1 wherein the internal switching circuit includes:

a first CMOS transmission gate having an input terminal for receiving a memory data bit and having an output terminal coupled to a switch output terminal (N10), wherein said first CMOS transmission gate has first and second control terminals which are activated by normal-operation memory control signals and which are inactivated by the test mode control signal;

a second CMOS transmission gate having an input terminal for receiving an input defective row address bit and having an output terminal coupled to the switch output terminal (N10), said second CMOS transmission gate having first and second control terminals to which are respectively coupled the test mode control signal TESTF signal and an inverted test mode control signal TESTF signal; and an output buffer circuit having an input terminal coupled to the switch output terminal N10 and having an output terminal coupled to the data output pin of the memory integrated circuit.

4. The status reporting system of claim 3 including a circuit for disabling the first CMOS transmission gate when the test mode control signal TESTF signal is active and also for enabling the second CMOS transmission gate when the test mode control signal is active.

5. The status reporting system of claim 3 wherein the output buffer, when in a data transmission mode, is enabled by an output enable signal to transmit data through the output buffer in a normal data mode when the test mode control signal is not active.

6. The status reporting system of claim 5 wherein the output buffer in not disabled by the output enable signal when the test mode control signal is active.

7. The status reporting system of claim 3 wherein the output buffer circuit includes a tri-state output buffer circuit having an input terminal coupled to the switch output terminal N10 and having an output terminal coupled to the data output pin of the memory integrated circuit, wherein the state of the tri-state buffer is controlled by the test mode control signal, when the test mode control signal is active, and wherein the state of the tri-state buffer is controlled by an output enable signal, when the test mode control signal is inactive.

8. The status reporting system of claim 3 wherein the normal-operation memory control signals include a write data control signal.

9. The status reporting system of claim 3 wherein the normal-operation memory control signals include a output latch control signal.

10. A reporting system for reporting one bit of a code word identifying a defective row of a memory integrated-circuit, comprising an internal switching circuit for selectively switching either a defective row address bit (FUSEB) or a memory data bit (DIN) to a data output pin of a memory integrated circuit, wherein said internal switching circuit is selectively controlled by a test mode control signal (TESTF) to provide either a memory data bit or a defective row address bit to the data output pin of the memory integrated circuit;

wherein the internal switching circuit includes a first CMOS transmission gate having an input terminal for receiving a memory data bit and having an output terminal coupled to a switch output terminal (N10), wherein said first CMOS transmission gate has first and second control terminals which are activated by normal-operation memory control signals and which are inactivated by the test mode control signal;

wherein the internal switching circuit also includes a second CMOS transmission gate having an input terminal for receiving an input defective row address bit and having an output terminal coupled to the switch output terminal (N10), said second CMOS transmission gate having first and second control terminals to which are respectively coupled the test mode control signal TESTF signal and an inverted test mode control signal TESTF signal; and an output buffer circuit having an input terminal coupled to the switch output terminal N10 and having an output terminal coupled to the data output pin of the memory integrated circuit.

11. The reporting system of claim 10 wherein the output buffer circuit includes a tri-state output buffer circuit having an input terminal coupled to the switch output terminal N10 and having an output terminal coupled to the data output pin of the memory integrated circuit, wherein the state of the tri-state buffer is controlled by the test mode control signal, when the test mode control signal is active, and wherein the state of the tri-state buffer is controlled by an output enable signal, when the test mode control signal is inactive.

12. The reporting system of claim 10 including a plurality of said internal switching circuits, each selectively switching one of a plurality of defective row address bits or memory data bits to a respective one of a plurality of data output pins of the memory integrated circuit wherein said internal switching circuits are selectively controlled by the test mode control signal and wherein said plurality of defective row address bits identify a defective row in the memory integrated circuit.

13. A reporting system for a code word identifying a defective row of a memory integrated-circuit, comprising a plurality of internal switching circuits for selectively switching either a defective row address bit (FUSEB) or a memory data bit (DIN) to a data output pin of a memory integrated circuit, wherein each of said internal switching circuits is selectively controlled by a test mode control signal (TESTF) to provide either a memory data bit or a defective row address bit to the data output pin of the memory integrated circuit;

wherein each of the plurality of internal switching circuits includes a first CMOS transmission gate having an input terminal for receiving a memory data bit and having an output terminal coupled to a switch output terminal (N10), wherein said first CMOS transmission gate has first and second control terminals which are activated by normal-operation memory control signals and which are inactivated by the test mode control signal;

wherein each of the plurality of internal switching circuits also includes a second CMOS transmission gate having an input terminal for receiving an input defective row address bit and having an output terminal coupled to the switch output terminal (N10), said second CMOS transmission gate having first and second control terminals to which are respectively coupled the test mode control signal TESTF signal and an inverted test mode control signal TESTF signal; and wherein each of the plurality of internal switching circuits includes an output buffer circuit having an input terminal coupled to the switch output terminal N10 and having an output terminal coupled to the data output pin of the memory integrated circuit.

14. The reporting system for a code word identifying a defective row of claim 13 wherein each of the output buffer circuit includes a tri-state output buffer circuit having an input terminal coupled to the switch output terminal N10 and having an output terminal coupled to the data output pin of the memory integrated circuit, wherein the state of each of the tri-state buffer is controlled by the test mode control signal, when the test mode control signal is active, and wherein the state of each of the tri-state buffer is controlled by an output enable signal, when the test mode control signal is inactive.

* * * * *